United States Patent
Andrews et al.

(10) Patent No.: US 6,472,904 B2
(45) Date of Patent: Oct. 29, 2002

(54) DOUBLE DATA RATE INPUT AND OUTPUT IN A PROGRAMMABLE LOGIC DEVICE

(75) Inventors: William B. Andrews, Long Pond, PA (US); Barry K. Britton, Orefield, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/864,284

(22) Filed: May 25, 2001

(65) Prior Publication Data

US 2002/0003436 A1 Jan. 10, 2002

Related U.S. Application Data

(60) Provisional application No. 60/207,371, filed on May 26, 2000.

(51) Int. Cl.[7] ............................................. H03K 19/173
(52) U.S. Cl. ............................... 326/38; 326/41; 326/93
(58) Field of Search ......................... 326/37–41, 93–98

(56) References Cited

U.S. PATENT DOCUMENTS

| | | | |
|---|---|---|---|
| 5,523,706 A | * | 6/1996 | Kiani et al. .................... 326/17 |
| 6,020,760 A | * | 2/2000 | Sample et al. ................. 326/37 |
| 6,265,894 B1 | * | 7/2001 | Reblewski et al. ........... 326/16 |

* cited by examiner

Primary Examiner—Don Phu Le

(57) ABSTRACT

A multi-functional programmable I/O buffer in a Field Programmable Gate Array (FPGA) device. The I/O buffer is programmably configurable to meet any of a wide range of I/O standards, be it single ended or differential, 5V, 3.3V, 2.5V or 1.5V logic, without the need for implementing multiple I/O buffers to properly handle each different iteration of I/O requirements. An embedded, internal programmable resistor (e.g., a programmable 100 ohm resistor) is programmably selected for use in differential I/O applications, thus eliminating the conventional requirement for the use of an external resistor connected to each differential receiver I/O pin. The present invention also separates I/O pads into groups in each of a plurality of banks in a programmable device (e.g., PLD, FPGA, etc.), with each group being separately powered by the user. The disclosed multi-functional I/O buffer may be programmably configured by the user to be, e.g., a single ended receiver or transmitter, a reference receiver or transmitter, or a differential receiver or transmitter. The pad logic of the multi-functional I/O buffer may include a double data rate input and output mode, each of which includes two flip-flop devices operating on opposite sides of a data clock signal. One of the two flip-flop devices may be borrowed from another logic element, e.g., from a shift register logic element.

2 Claims, 12 Drawing Sheets

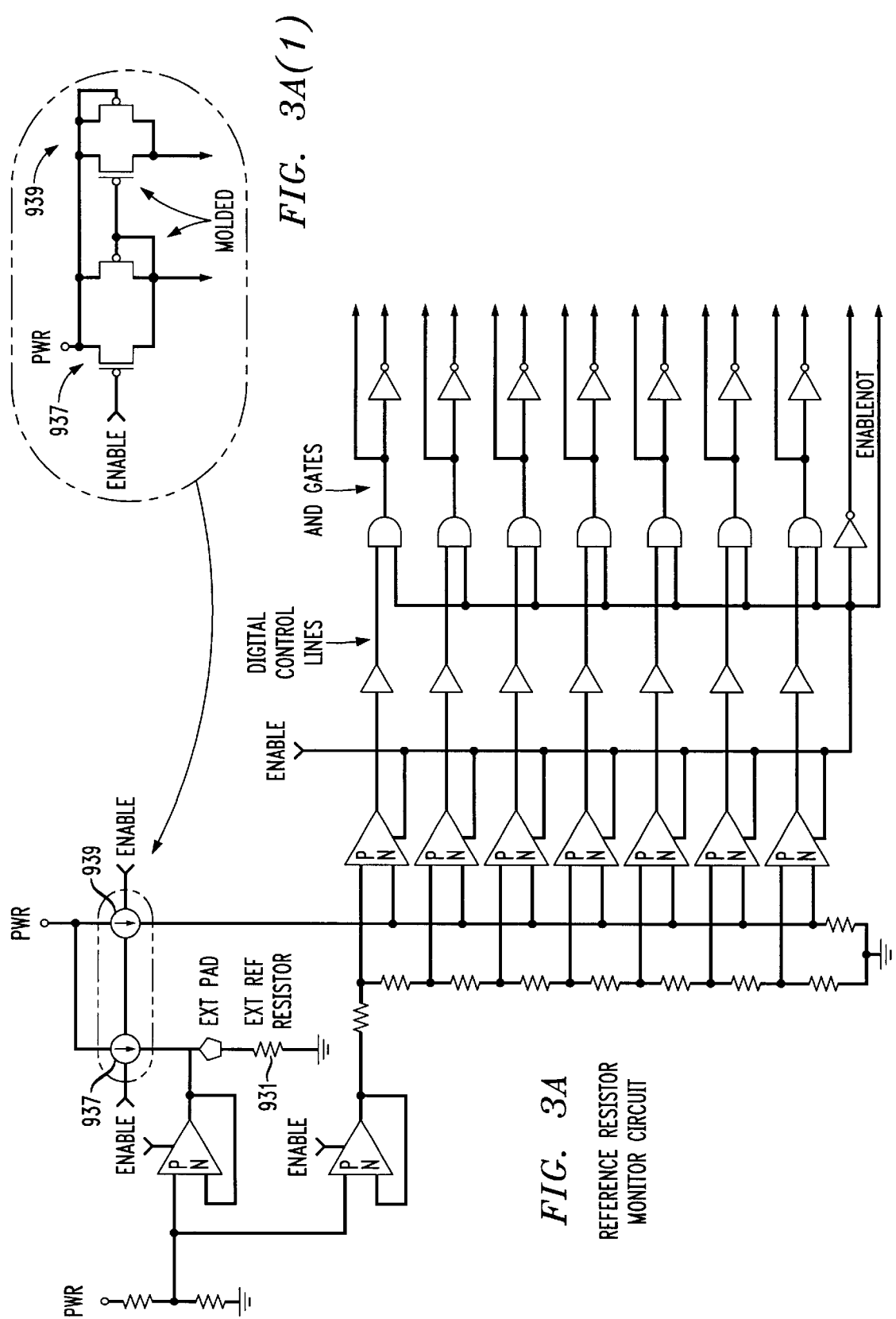

DIFFERENTIAL RESISTOR CIRCUIT

RECEIVER DEPICTION

TRANSMIT DEPICTION

DOUBLE DATA RATE INPUT AND OUTPUT IN A PROGRAMMABLE LOGIC DEVICE

This application claims priority from U.S. Provisional Application No. 60/207,371 entitled "Novel Field Programmable Gate Array" filed on May 26, 2000, the specification of which is hereby expressly incorporated herein by reference.

BACKGROUND OF THE INVENTION

1. Field of the Invention

This invention relates generally to field programmable gate arrays (FPGAs). In particular, it relates to the implementation of improved architectures and functions to interface with an FPGA.

2. Background of Related Art

A Field Programmable Gate Array (FPGA) is a programmable integrated circuit which provides a customized logic array and functionality to a particular customer.

FIG. 8 depicts a conventional Field Programmable Gate Array (FPGA).

In particular, as shown in FIG. 8, an FPGA 400 typically includes four distinct features: configuration memory 406, input/output (I/O) blocks 408–414, configurable logic blocks 404, and a routing network 402 between the internal components.

Configuration memory 406 provides access between the elements of the FPGA 400 and one external controlling device (e.g., a programmer). Based on the contents of the configuration memory 406, various logical functions of the configurable logic blocks 404 are enabled and wired together via a configuration of the routing network 402. Similarly, certain logic blocks are provided I/O access through various types of I/O devices 408–414, as determined by both the configuration memory 406 and the routing provided by the routing network 402.

The configuration memory 406 may be, e.g., static RAM (SRAM). The configuration memory bits turn elements or switches on or off in embedded elements of the configurable logic blocks 404, and establish routing between elements of the FPGA 400, to define the functionality of the FPGA 400.

Typically, individual memory bits of the configuration memory 406 define the desired functionality of the FPGA device 400. These configuration memory bits are conventionally loaded one at a time using data lines and address lines directly to the configuration memory 406 (e.g., SRAM) over an external bus 420 from an external source. All embedded elements are programmed similarly using the same format to the configuration memory 406.

Other types of configuration memory 406 typically include, e.g., EPROM or EEPROM, anti-fused, fused, or other storage devices, providing either one-time programmability, or multiple reprogrammability. The configuration memory 406 may be formed of one or more types of memory (e.g., SRAM and EEPROM).

The I/O blocks 408–414 conventionally provide direct connection between an internal, embedded component of the FPGA 400, and external devices. The I/O blocks 408–414 may be hard-wired and/or configured and routed based on the user-instructed configuration stored in the configuration memory 406.

Typically, multiple I/O blocks are provided each conforming to a separate transmission standard. For instance, a first I/O block may be provided to allow for 5 volt powered, single ended transmission, another for 5 volt powered, differential transmission, another for low voltage such as 3.3 volt powered single ended transmission, etc. To provide flexibility for an end user, multiple I/O circuits are required to accommodate the broadest range of possible uses by the user.

The routing network 402 is programmably defined by the configuration memory 406 to route signaling between the internal logic blocks of the FPGA. The routing network 402 carries signal traffic between the various internal, embedded components of the FPGA 400. Some portions of the routing network 402 may be directly connected or hard wired and/or may not be fully programmable by the user.

FPGA devices often include embedded run-time memory 450 in addition to the configuration memory 406. The embedded run-time memory 450 is accessible until configuration of the FPGA 400 is complete. Moreover, the configuration memory 406 is generally not reprogrammed while the FPGA device 400 is in operation.

FPGA devices 400 are typically programmed using an appropriate configuration and routing software application which inputs a user's particular requirements, and determines a best configuration of the routing of the FPGA 400 by steps generally referred to as "partitioning", "placing", and "routing", to ultimately configure the elements of the FPGA 400 to meet the particular user's needs.

In general, FPGAs are targeted toward higher-speed applications, which require high-speed I/O interfaces. The I/O interfaces of conventional FPGA devices (e.g., those conforming to differential transmission techniques such as LVDS or LVPECL standards) require the inclusion of an external resistor by the user (e.g., circuit board designer) to meet given I/O standards. Unfortunately, use of an external resistor increased costs to the user. Moreover, signal integrity is dependent on the proximity of the termination resistor to the receiver, and thus external resistance reduces signal integrity at the receiver.

In other conventional devices, particular conformance to certain standards (e.g., LVDS or LVPECL) is provided, by selection of one of a plurality of differently dedicated I/O buffers. However, each of these dedicated I/O buffers offer little flexibility to perform in other capacities, or required complimentary logic to do so. Unfortunately, a large number of dedicated I/O buffers and/or such complimentary logic requires additional silicon space, making the FPGA device larger and possibly consume additional power.

There is thus a need for a more flexible FPGA device, allowing a wide range of flexibility in I/O interfacing without requiring significantly more silicon space in an integrated circuit.

SUMMARY OF THE INVENTION

In accordance with the principles of the present invention, a multi-function I/O buffer in a programmable device comprises an enablable differential receiver, and an embedded differential resistance on a same integrated circuit as the enablable differential receiver.

A method of providing multi-functionality in an I/O buffer of a programmable device in accordance with another aspect of the present invention comprises programmably enabling either a differential receiver or a single ended receiver. A differential transmitter or a single ended transmitter is programmably enabled. If the differential receiver is enabled, an embedded resistance between input terminals of the differential receiver is also programmably enabled. If the single ended receiver is enabled, the embedded resistance is programmably disabled.

In yet another aspect of the present invention, an I/O bank in a programmable device comprises a plurality of groups of I/O buffers, each of the I/O buffers being bonded to an external pin for power input. Each of the I/O buffers is capable of being powered at a different voltage level.

In accordance with still another aspect, an I/O element of a programmable logic device relating to a single external pin of the programmable logic device comprises at least two input flip-flop devices. A first one of the two input flip-flop devices is clocked on a first edge of a clock signal, and the other input flip-flop device is clocked on a second edge of the clock signal, the second edge being opposite the first edge.

Still another aspect includes an I/O element of a programmable logic device relating to a single external pin of the programmable logic device comprising at least two output flip-flop devices. A first one of the two output flip-flop devices is clocked on a first edge of a clock signal. A second one of the two output flip-flop devices is clocked on a second edge of the clock signal, the second edge being opposite the first edge.

A method of providing a double data rate mode in a programmable logic device in accordance with an aspect of the invention comprises configuring a first flip-flop to input a data signal clocked on a first edge of a clock signal. A second flip-flop is configured to input the data signal clocked on a second edge of the clock signal opposite the first edge of the clock signal.

BRIEF DESCRIPTION OF THE DRAWINGS

Features and advantages of the present invention will become apparent to those skilled in the art from the following description with reference to the drawings, in which:

FIG. 6B shows the DDR output mode of FIG. 6A in more detail.

FIG. 7B shows the DDR input mode of FIG. 7A in more detail.

DETAILED DESCRIPTION OF ILLUSTRATIVE EMBODIMENTS

The present invention relates to the provision of a multi-functional programmable I/O buffer in a Field Programmable Gate Array (FPGA) device. The I/O buffer is programmably configurable to meet any of a wide range of I/O standards, be it single ended or differential, 5V, 3.3V, 2.5V or 1.5V logic, without the need for implementing multiple I/O buffers to properly handle each different iteration of I/O requirements.

In accordance with the principles of the present invention, a high-speed I/O interface is provided which includes an embedded, internal programmable resistor (e.g., a programmable 100 ohm resistor) for use in differential I/O applications, thus eliminating the conventional requirement for the use of an external resistor connected to each differential receiver I/O pin. The present invention also separates I/O pads into groups in each of a plurality of banks in a programmable device (e.g., PLD, FPGA, etc.), with each group being separately powered by the user. In this way, the user can implement many different I/O standards all at the same time in a single programmable device.

The disclosed multi-functional I/O buffer may be programmably configured by the user to be, e.g., a single ended receiver or transmitter, a reference receiver or transmitter, or a differential receiver or transmitter. The disclosed multi-functional I/O buffer provides true differential interfaces without the use of any per-I/O path external devices for level adjustment or receiver termination, e.g., to conform to LVDS or LVPECL standards. The internal, embedded programmable resistance for use in a differential receiver provides programmable termination resistance extremely close to the receiving buffer, thus greatly improving signal integrity at the receiver.

Figure 1A:
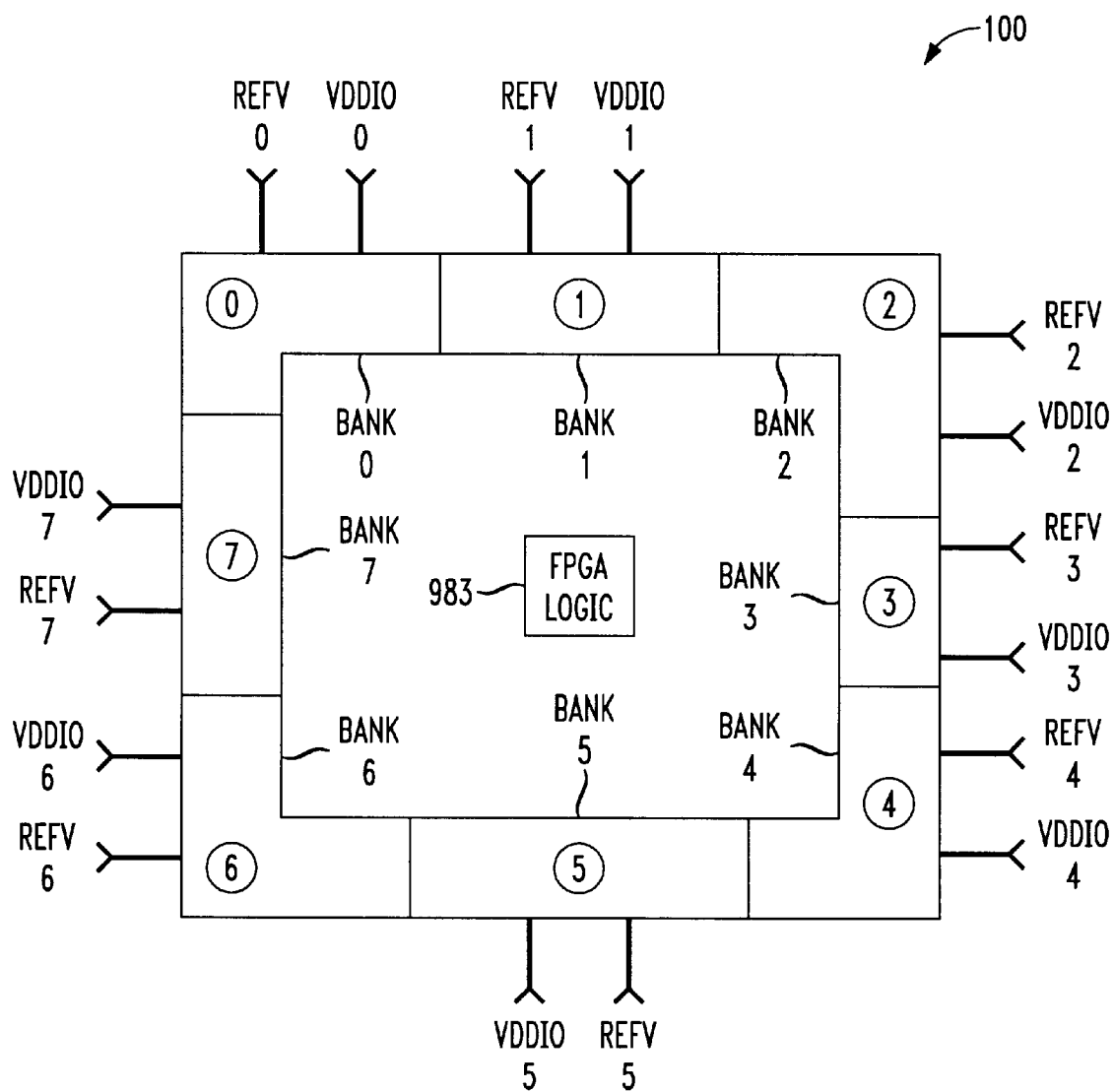
FIG. 1A depicts a plurality of I/O banks configured around a periphery of a FPGA, in accordance with the principles of the present invention.

FIG. 1A depicts a plurality of I/O banks configured around a periphery of a FPGA, in accordance with the principles of the present invention.

In particular, as shown in FIG. 1A, a plurality of programmable multi-function I/O banks are placed around the perimeter of a programmable device such as an FPGA 100. The FPGA 100 includes FPGA logic 983 and/or other embedded elements surrounded by the programmable multi-function I/O buffer banks (e.g., bank 0 to bank 7). Each bank of programmable multi-function I/O buffer banks is separately powered, allowing each bank of programmable multi-function I/O buffer banks to support different logic voltage levels. Moreover, in the given embodiment, the power to each bank of programmable multi-function I/O buffer banks is brought out to an external pin, allowing a customer to provide the power based on their individual needs.

While each programmable multi-function I/O buffer bank is separately powered in the given embodiment, it is also within the scope of the invention to internally couple the power of some of the programmable multi-function I/O buffer banks.

In addition to each programmable multi-function I/O buffer bank having its own power pin, each also has its own voltage reference pin used by logic in the relevant I/O buffers to sense incoming signals.

Figure 1B:
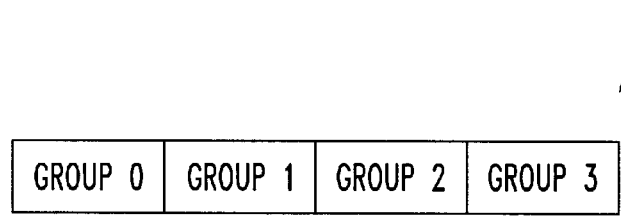
FIG. 1B depicts the separation of each I/O bank into a plurality of groups, each group being separately powered by an external source, and each group having a capability to reference different voltage levels than another one of the groups.

FIG. 1B depicts the separation of each programmable multi-function I/O bank into a plurality of groups, each group being separately powered by an external source, and each group having a capability to reference different voltage levels than another one of the groups. For instance, in the disclosed embodiment, each programmable multi-function I/O buffer bank includes four (4) groups of I/O buffers. The specific number of groups of I/O buffers in each multi-function I/O buffer bank depends upon, e.g., the size of the multi-function I/O buffer bank, the particular application, etc.

Importantly, each group of I/O buffers is powered through an externally accessible power pin VDDIO specifically placed for the respective group of I/O buffers. Thus, if a customer desires one group of I/O buffers to handle LVTTL standard signals, the respective VDDIO power pin to that particular group of I/O buffers would be driven with a 3.3 volts source.

Figure 1C:
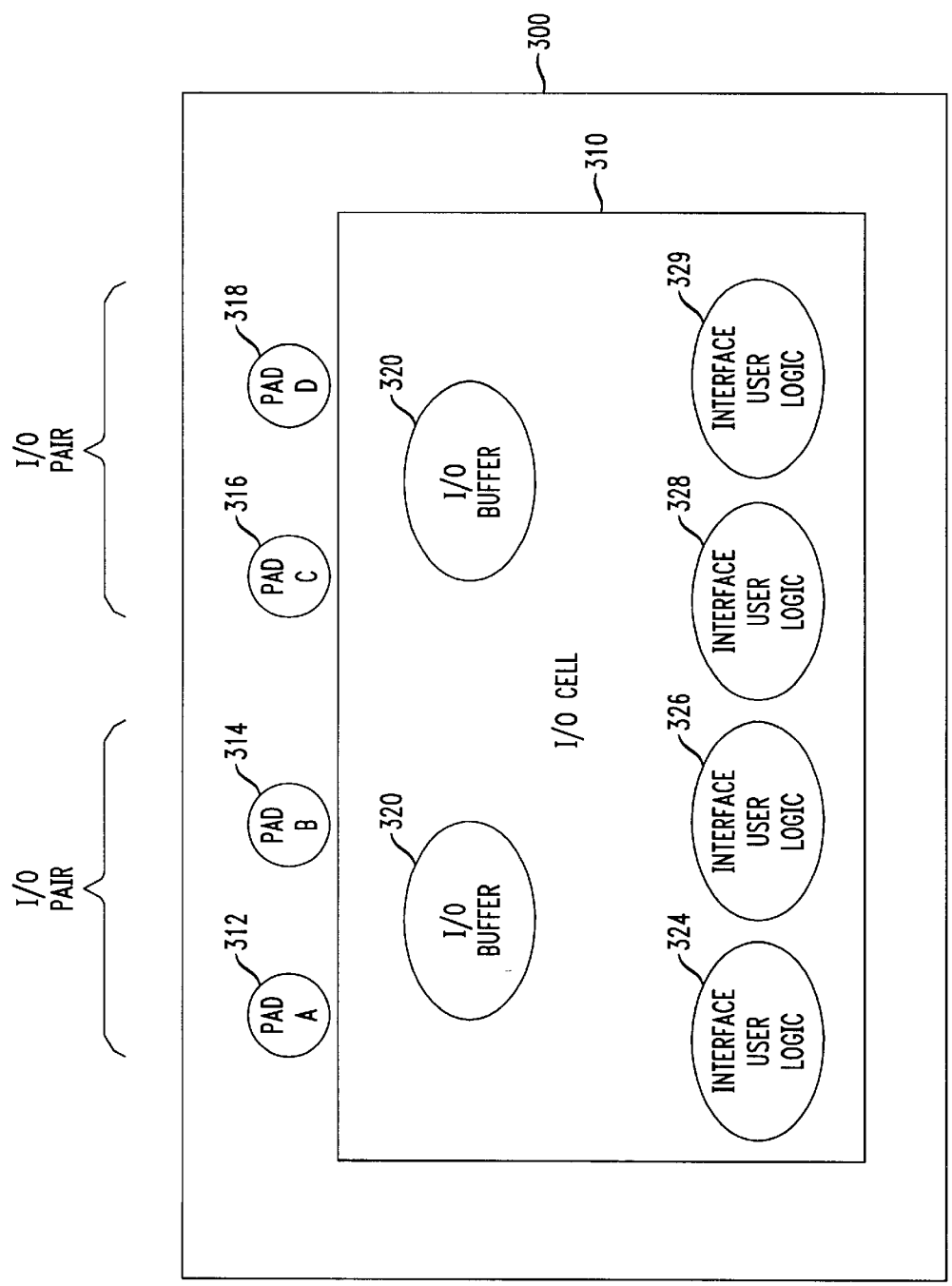
FIG. 1C shows an exemplary multi-functional I/O buffer in a group of a bank in an FPGA, in accordance with the principles of the present invention.

FIG. 1C shows an exemplary multi-functional I/O buffer 300 in a group of a bank in an FPGA 100, in accordance with the principles of the present invention.

In particular, as shown in FIG. 1C, each multi-functional I/O buffer 300 in each group of each bank includes an I/O cell 310. Each I/O cell 310 includes a plurality of I/O pads, e.g., four I/O pads 312–318. The I/O pads 312–318 are broken into pairs, and each pair of I/O pads 312–318 may be configured for use as a single ended I/O signal line (one used, one not used), or for use as a differential I/O signal line (both I/O pads of the pair used).

Each I/O cell 310 includes a plurality of multi-function I/O buffers 320 and interface user logic 324–329 suitable to the particular application. Each I/O buffer 320 is provided with suitable signaling, e.g., independent clock enables, local set/reset, and/or global set/reset signals.

In accordance with the principles of the present invention, the multi-function I/O buffers 320 are capable of being programmed individually at every user I/O pin. They can be programmed for use as single-ended receivers or transmitters, differential receivers or transmitters (e.g., LVDS or LVPECL standards), and/or to use logic levels suitable to a particular application (e.g., 1.5 v, 1.8 v, 2.5 v, 3.3 v, 5 v logic). Moreover, the disclosed multi-function I/O buffers 320 can be programmed as either an input or as an output.

In LVDS and LVPECL modes, there are four multi-function I/O buffers 320 (only two shown) per programmable I/O cell 310. The four multi-function I/O buffers 320 are divided into two pairs, where each pair is linked, and each pair shares two pads. In this manner, the A and B paired I/O pads 312–314 or the C and D paired I/O pads 316–318 become a differential pair. Paired I/O pads can be replaced with other paired I/O pads. For instance, I/O pads A and B can be replaced with I/O pads C and D, respectively.

Figure 2:
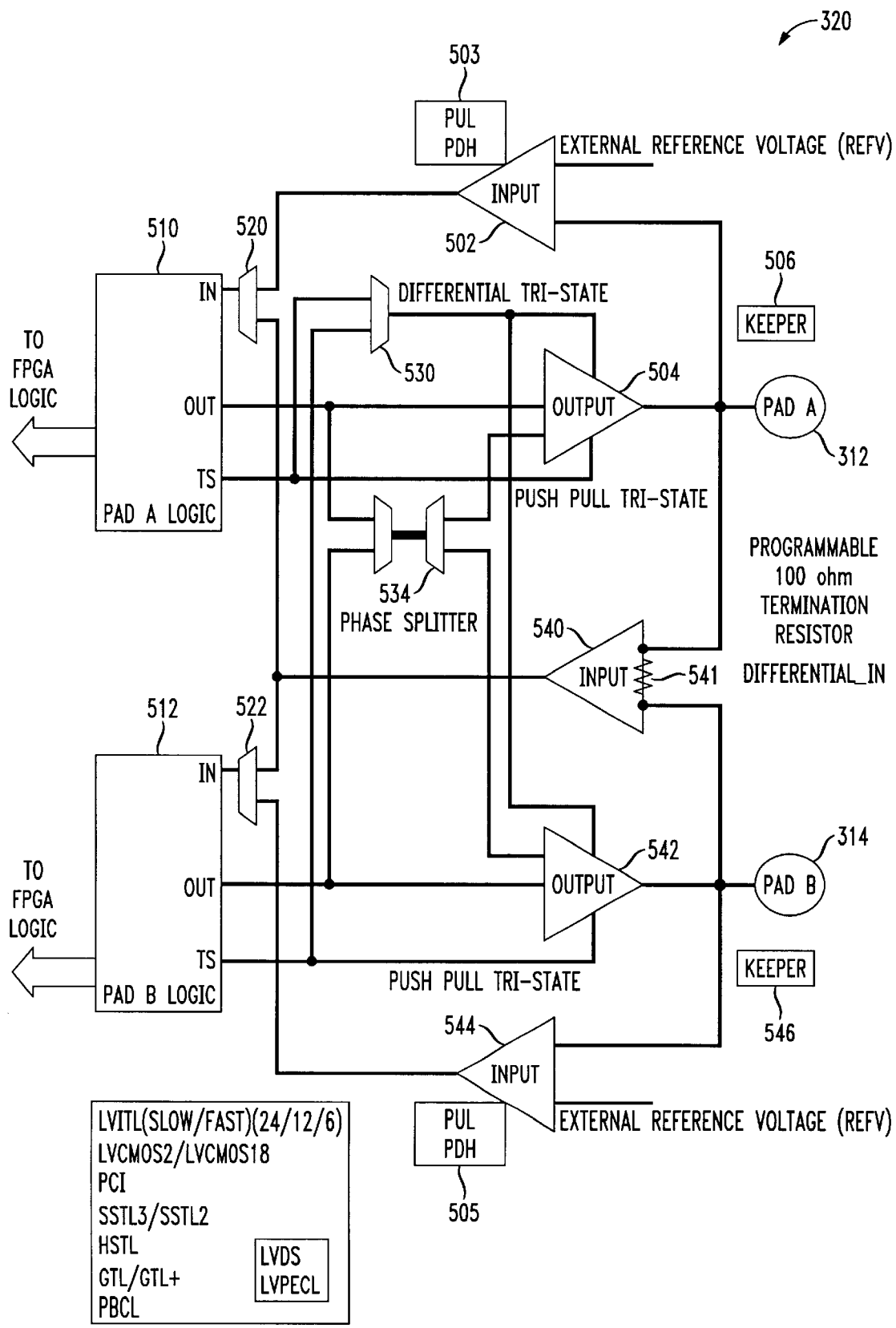
FIG. 2 shows an exemplary programmable I/O buffer in a group of a block of an FPGA, in accordance with the principles of the present invention.

FIG. 2 shows an exemplary programmable I/O buffer in a group of a block of an FPGA, in accordance with the principles of the present invention.

In particular, FIG. 2 shows the programmability and flexibility of the multi-functional I/O buffers 320 in accordance with the principles of the present invention.

Each multi-functional I/O buffer 320 includes configurable single ended input buffers 502, 544 and a differential receiver 540. The single ended input buffers 502, 544 are configurable to operate with or without a customer input external reference voltage (refv).

The single ended input buffers 502, 544 need not necessarily use the customer input reference voltage refv. Each single ended input buffer 502, 544 in the disclosed embodiment may include a plurality of different receiver circuits, programmably selected by the customer. For instance, the disclosed single ended input buffers 502, 544 include a single ended receiver which can handle logic voltages down to 1.8 volts, a reference type receiver which handles logic voltages with respect to the customer input reference voltage refv at about 1.5 volts, and another reference type receiver which handles higher logic voltages with respect to the customer input reference voltage refv at about 1.8 volts and above.

The single ended input buffers 502, 544 and the differential input receiver 540 are preferably each separately configurably turned ON (enabled) or OFF (disabled). Moreover, the single ended input buffers 502, 544 each include a programmable pull-up and/or pull-down resistance 503, 505, respectively. The pull-up/pull-down resistances 503, 505 can be, e.g., 100K and 50K, respectively, and can be programmed to be IN or OUT of the circuit.

Importantly, the differential receiver 540 function includes a programmably configurable embedded resistance 541 across the differential input terminals of the differential receiver 540. While the disclosed embodiments relate to a 100 ohm embedded resistance 541, the principles of the present invention envision a differential resistance of any suitable value for the particular application.

The output signals either from the single ended input buffers 502, 544 or from the differential input receiver 540 are selectably input to respective PAD logic (PAD A logic 510 and PAD B logic 512, respectively) using multiplexers 520, 522, respectively.

Keeper circuits 506, 546 may be implemented to weakly maintain tri-stated input signals on I/O pads 312, 314, respectively. The keeper circuits 506, 546 may be configurably programmed to be ON (enabled) or OFF (disabled). The keeper circuits 506, 546 may each contain, e.g., a programmable latch/flip-flop to enable very fast latching of data from any I/O pad.

The multi-function I/O buffers 320 further include tri-stateable output buffers 504, 542. The output buffers 504, 542 are tri-stateable under the control of a tri-state signal ts from the respective PAD A logic 510 or PAD B logic 512. The tri-state signal ts is programmed to tri-state the output of one of the output buffers 504, 542 when the multi-function I/O buffer 320 is configured to operate in a single-ended output mode. In single ended mode, the out and ts signals from the respective PAD logic 510, 512 are used.

The element referred to loosely as a "phase splitter" 534 creates a true and complement signal, one to the PAD A logic 510 and another to the PAD B logic 512. The phase splitter 534 also selects for output (in differential mode) the output signal line from either the PAD A logic 510 or the PAD B logic 512. Since the output buffers 504, 542 are tri-stateable, multiplexer 530 selects the tri-state signal ts from either the PAD A logic 510 or from the PAD B logic 512.

The programmable resistance 541 in the disclosed embodiment requires use of a single external resistor (e.g., a 1%, 100 ohm resistor) to provide a reference level from which all multi-function I/O buffers 320 derive an equivalent resistance 541. Thus, instead of an external resistor between each and every differential input pair, only one external resistor is required no matter how many I/O lines are implemented in the operational FPGA device 100.

Figure 3B:
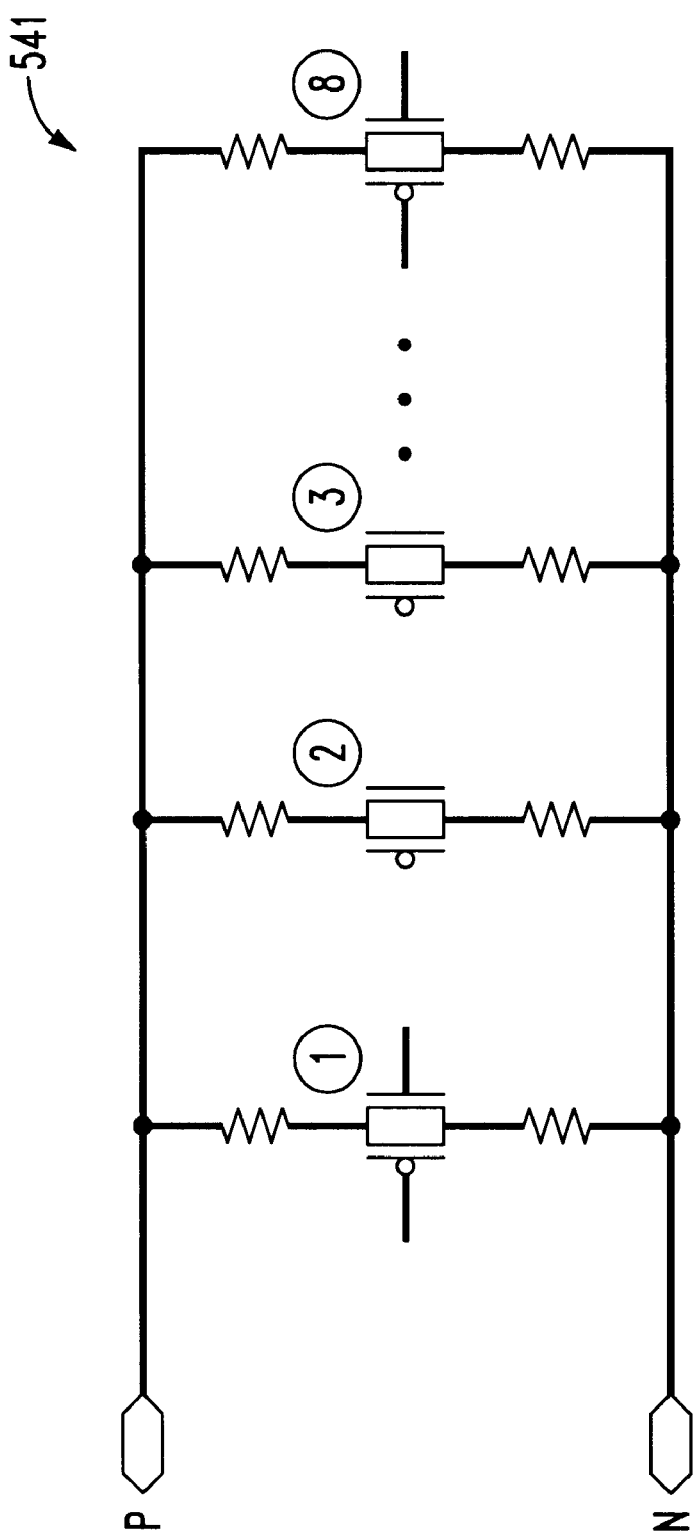
FIGS. 3A, 3A(1) and 3B show an exemplary reference resistor monitor circuit (FIGS. 3A, 3A(1)) and accompanying programmable differential input resistor circuit (FIG. 3B), in accordance with the principles of the present invention.

FIGS. 3A and 3B show an exemplary reference resistor monitor circuit (FIG. 3A) and accompanying programmable differential input resistor circuit (FIG. 3B), in accordance with the principles of the present invention.

In particular, as shown in FIG. 3A, only one external reference resistance 931 is required by the multi-function I/O buffers 320 to provide a reference level to all multi-function I/O buffers 320 in the FPGA device 100. The current sources 937, 939 are shown in FIG. 3A(1) in greater detail including enable signaling.

The reference level provided by the single external resistance 931 drives a series of digital control lines, which are enabled by a respective series of AND gates.

As shown in FIG. 3B, the digital control lines enable or disable selected legs of a differential resistance circuit 541, providing the desired resistance at a very proximate location between the input terminals of the differential input receiver 540.

Figure 4:
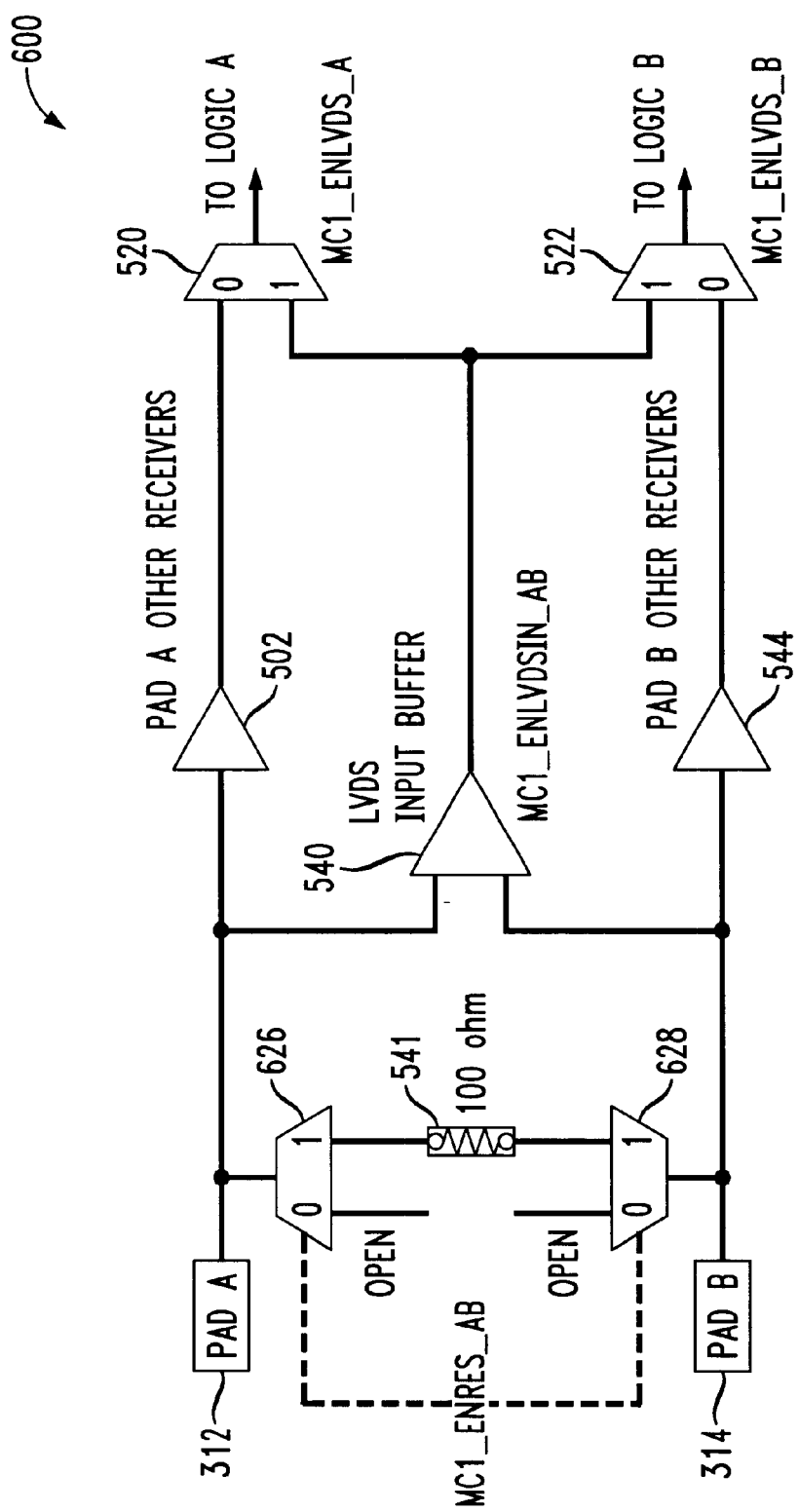
FIG. 4 shows an exemplary LVDS receiver diagram of the exemplary multi-functional programmable I/O buffer in a group in a bank in an FPGA, in accordance with the principles of the present invention.

FIG. 4 shows an exemplary LVDS receiver diagram of the exemplary multi-functional programmable I/O buffer in a group in a bank in an FPGA, in accordance with the principles of the present invention. In particular, FIG. 4 depicts the programmable I/O buffer 320 shown in FIG. 2, but simplified to show the active components in a configuration of an LVDS standard input.

FIG. 4 includes depiction of multiplexers 626 and 628, which were not explicitly shown in FIG. 2 to simplify the explanation thereof. Multiplexers 626 and 628 depict the programmability of the differential resistance 541 by allowing it to be turned ON or OFF with an appropriate enable signal MC1_ENRES_AB.

Figure 5:
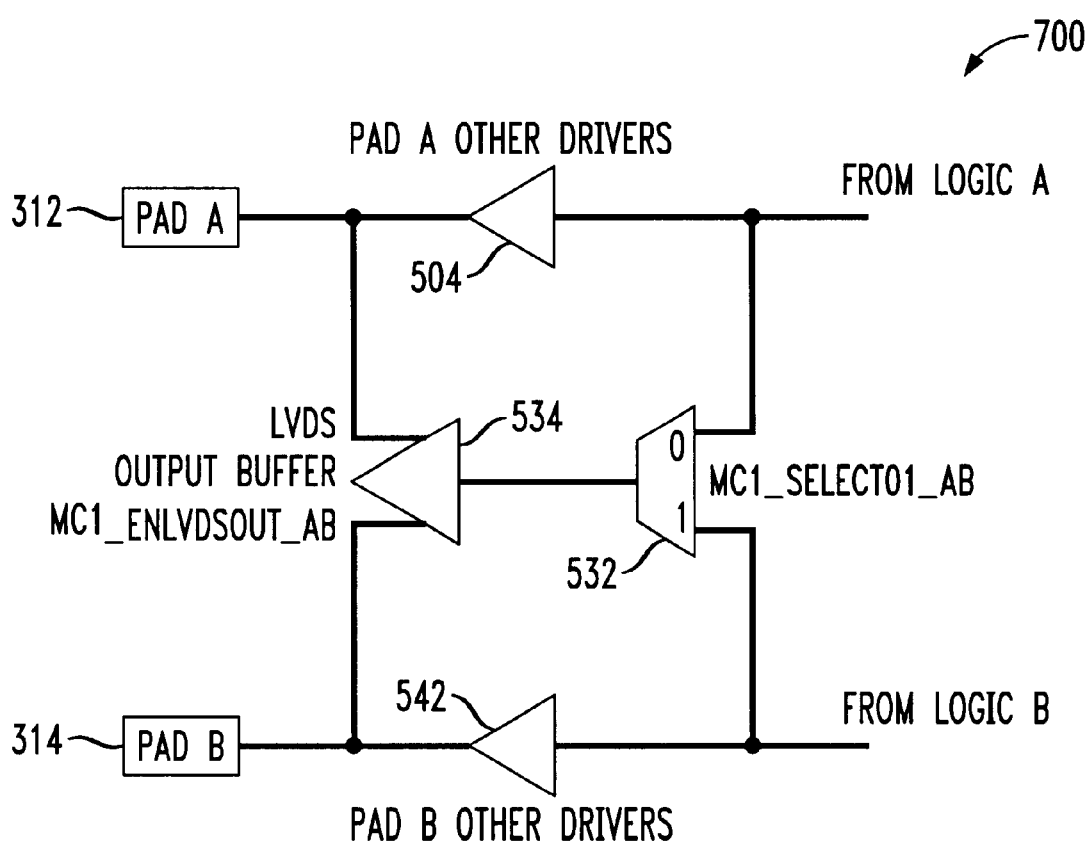
FIG. 5 shows an exemplary LVDS transmit diagram of the exemplary multi-functional programmable I/O buffer in a group in a bank in an FPGA, in accordance with the principles of the present invention.

Similarly, FIG. 5 shows an exemplary LVDS transmit diagram of the exemplary multi-functional programmable I/O buffer in a group in a bank in an FPGA, in accordance with the principles of the present invention. In particular, FIG. 5 depicts the programmable I/O buffer 320 shown in FIG. 2 but simplified to show the active components in a configuration of an LVDS standard output.

Using a programmable embedded resistor in an I/O buffer of an FPGA in accordance with the principles of the present invention, standards such as LVDS, LVPECL, LVCMOS, HSTL, SSTL, GTL, LVTTL, PCI and PECL can be met without requiring the use of external resistance or an external reference voltage supply.

Double Data Rate Input/Output

In a preferred embodiment, the I/O buffers 320 include the flip-flops and control logic necessary to implement double data rate (DDR) input and/or double data rate output. DDR functionality is very useful for emerging networking standards such as POS-PHY4 and Rapid I/O.

Conventional I/O buffer logic includes a single flip-flop in an input direction and a single flip-flop in an output direction, clocked by a desired clock signal. However, at least two flip-flops are required in either direction to implement DDR, and thus such conventional I/O buffer logic cannot provide a DDR mode.

Conventional DDR implementations on a programmable logic chip have used on-chip PLLs to implement DDR at high speed, but this increases complexity and power requirements of the programmable logic device. Moreover, these conventional implementations also used general programmable logic, resulting in reduced speed, increased power, and overall reduced density of the device.

In accordance with this aspect of the invention, the I/O buffer relating to any particular external pin of a programmable logic device (e.g., an FPGA) includes four flip-flops (two in an input direction, and/or two in an output direction). Ideally, the DDR mode may be programmably turned ON (enabled) or OFF (disabled).

The present invention enhances the logic in the I/O buffer (e.g., in a programmable I/O cell sometimes referred to as a "PIC") to make four flip-flops available for configuration in a DDR mode. This avoids the need to use flip-flops in another element of the programmable device (e.g., in a programmable logic cell (PLC)). This keeps the flip-flops close to the I/O buffer, enhancing speed and reliability of the device.

Figure 6A:
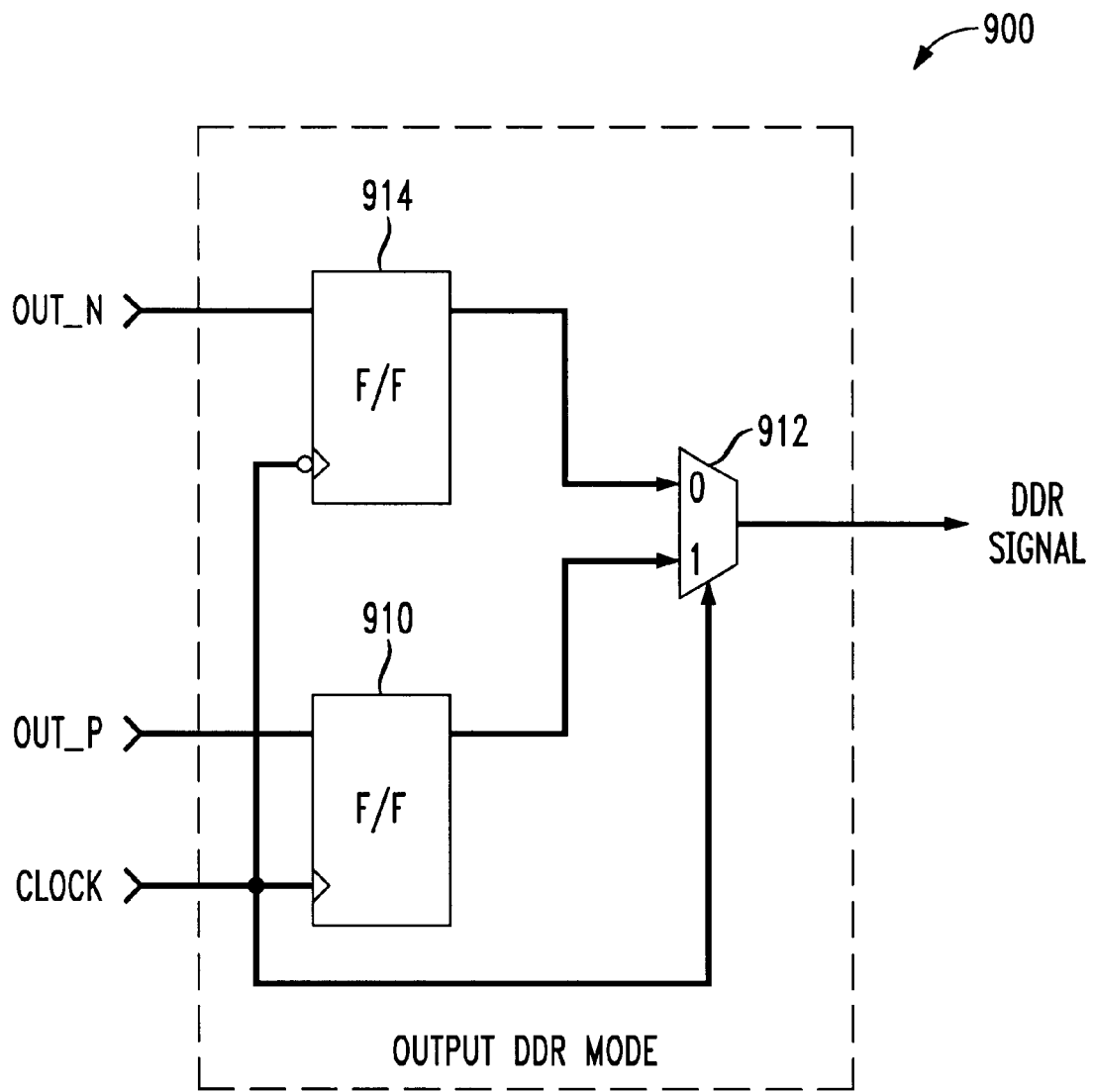
FIGS. 6A and 6B show the implementation of a double data rate (DDR) output in the PAD logic of a multi-functional I/O buffer of a programmable logic device (PLD) (e.g., an FPGA device), in accordance with the principles of the present invention.
Figure 6B:
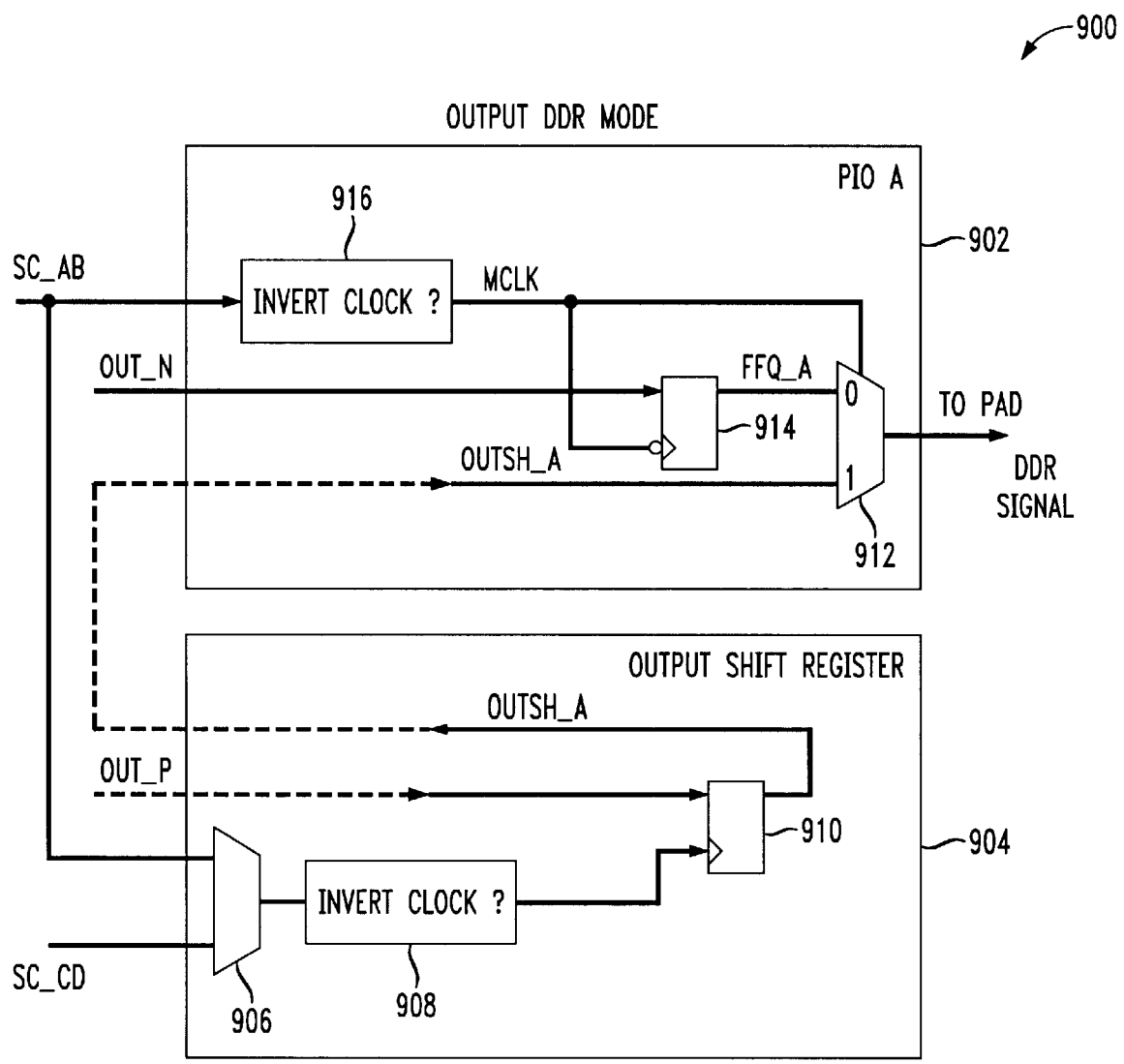

FIGS. 6A and 6B show the implementation of a double data rate (DDR) output in the PAD logic of a multi-functional I/O buffer of a programmable logic device (PLD) (e.g., an FPGA device), in accordance with the principles of the present invention. FIG. 6B shows the DDR output mode of FIG. 6A in more detail.

In particular, FIG. 6A is a simplified diagram of the DDR mode concept showing two flip-flops 914, 910 triggered on opposite edges of a clock signal CLOCK. The first flip-flop 914 receives a signal OUT_N from, e.g., a logic cell, for output by the particular I/O pin relating to the I/O buffer including the output DDR mode. The second flip-flop 910 receives another signal OUT_P.

The outputs of the two flip-flops 914, 910 are multiplexed by a multiplexer 912 controlled by the clock signal CLOCK to output data from one flip-flop (register) on a first edge (e.g., positive edge) of the clock signal and to output data from the other flip-flop on the opposite edge (e.g., negative edge) of the clock signal, thus reducing or minimizing pin requirements.

If a race condition exists or is contemplated, a delay of the CLOCK signal may be utilized to control the multiplexer 912.

Thus, a programmable logic device (e.g., an FPGA) contains dedicated logic in the programmable I/O buffer (PIO) solely for the purpose of implementing a DDR function.

FIG. 6B shows a specific implementation of the output DDR mode shown in FIG. 6A, making use of a flip-flop borrowed from a shift register in a FPGA device.

In FIG. 6B, the clock signal transition direction is programmable to the flip-flops 914, 910 via programmable IN or OUT inverters 916, 908. Moreover, a multiplexer 906 allows programmable control over the clock signal (SC_CD) to the second flip-flop 910.

The DDR output circuitry 900 may be configured for programmable enabling. Thus, when the DDR output circuitry 900 is programmably enabled, the flip-flops 914, 910 become active.

In another embodiment, the programmable logic device (PLD) may contain one or more device input shift registers that divide incoming data rates, and one or more device output shift registers that multiply outgoing data rates. When DDR mode is selected, some of these shift registers may be used either as one or both of the input or output DDR registers.

Figure 7A:
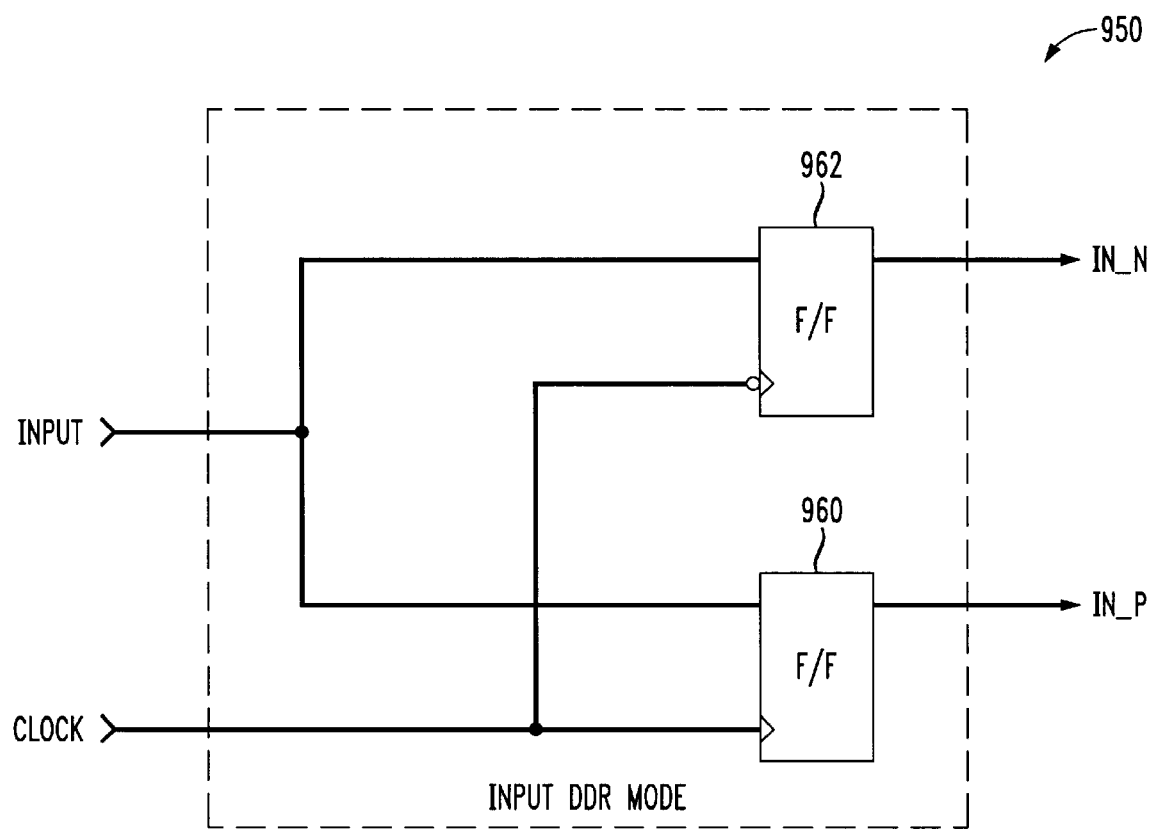
FIGS. 7A and 7B show the implementation of a double data rate (DDR) input in the PAD logic of a multi-functional I/O buffer of a programmable logic device (PLD) (e.g., an FPGA device), in accordance with the principles of the present invention.
Figure 7B:
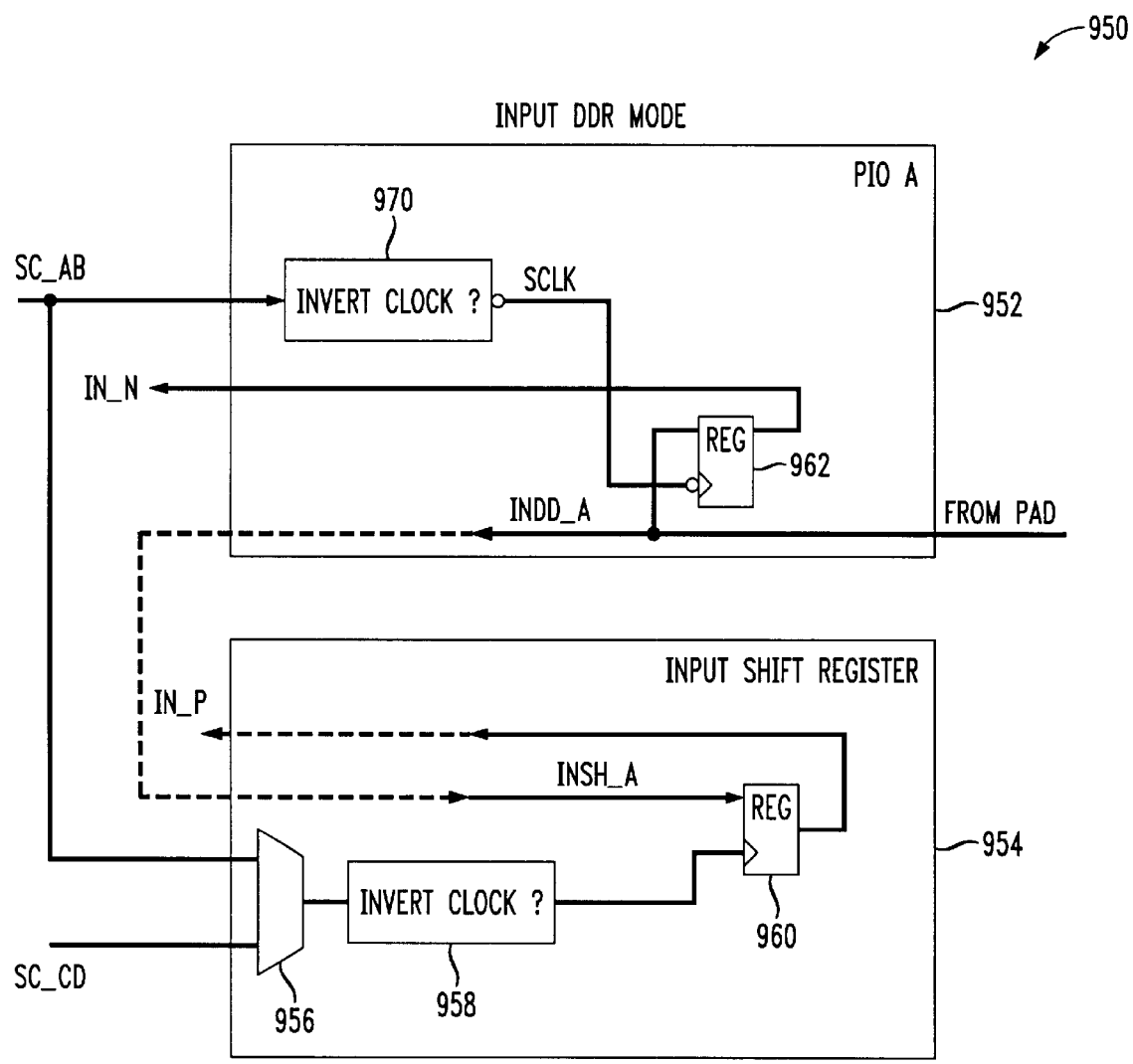
Figure 8:
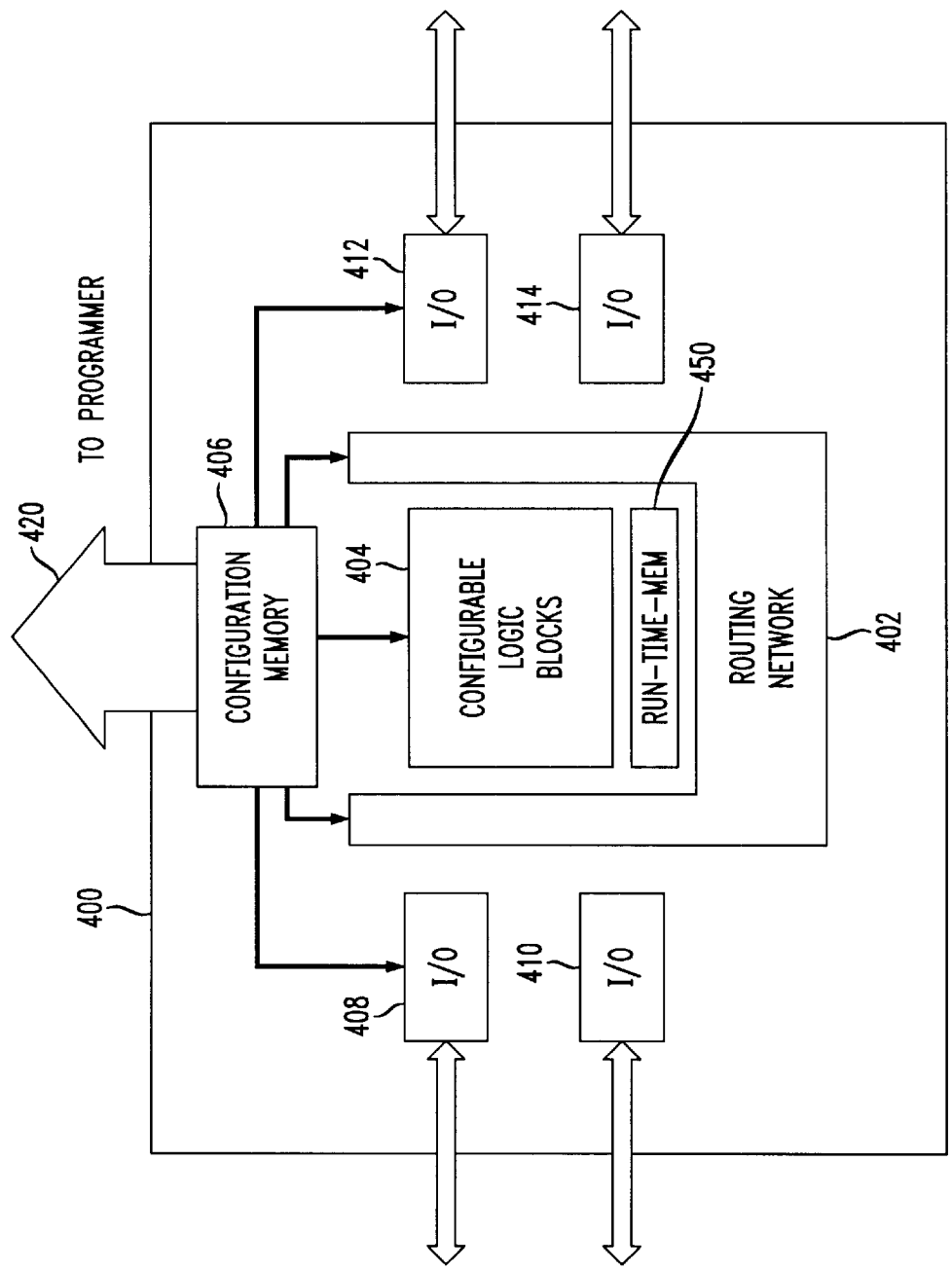
FIG. 8 shows a conventional Field Programmable Gate Array (FPGA).

FIGS. 7A and 7B show the implementation of a double data rate (DDR) input in the PAD logic of a multi-functional I/O buffer of a programmable logic device (PLD) (e.g., an FPGA device), in accordance with the principles of the present invention. FIG. 7B shows the DDR input mode of FIG. 7A in more detail in a specific implementation in an FPGA utilizing a flip-flop of a shift register.

In particular, as shown in FIGS. 7A and 7B, an input signal INPUT is fed to two flip-flops 962, 960 relating to a single I/O buffer. When the DDR input circuitry 950 is programmably enabled, the pair of input flip-flops (registers) 962, 960 is activated. The flip-flops 962, 960 are triggered on opposite edges of the clock signal CLOCK, and output separate data streams routed, e.g., toward an FPGA logic block. The output data streams may or may not be multiplexed, based on the needs of the chip designer.

FIG. 7B shows a specific embodiment of the input DDR mode in accordance with the principles of the present invention, including programmability of the phase of the clock signal using enablable clock inverters 970, 958, and/or an enabling multiplexer 956 to allow the clock signal to be presented to the second flip-flop 960.

In another embodiment, only one input register and one output register per I/O need be implemented. In this case, I/Os may be grouped in pairs (e.g., as would be used in differential I/O applications such as are called out for LVPECL and LVDS I/O standards). In this case, one of the two I/O pins is the positive version and the other I/O pin is the negative version of a differential signal. In this case, instead of using the input register and/or the output register from a dedicated shift register, these registers may be borrowed from the other I/O in the I/O buffer pair. Dedicated routing may be programmably selected to direct the output of the other I/Os output register into the needing output multiplexer. Dedicated routing may also programmably direct the input from the I/O buffer into the other input register.

The use of a dedicated DDR function using dedicated flip-flops improves speed and density, and reduces power in the relevant device, e.g., in an FPGA.

While the present invention has been described specifically with respect to embodiments of an FPGA, the present invention has applicability to programmable logic devices (PLD) in general.

While the invention has been described with reference to the exemplary embodiments thereof, those skilled in the art will be able to make various modifications to the described embodiments of the invention without departing from the true spirit and scope of the invention.

What is claimed is:

1. A programmable input/output (I/O) cell of a programmable logic device, comprising:

a plurality of I/O buffers, each buffer including a flip flop and configurable to transmit and receive data through an associated I/O pin;

a shift register coupled to each of the I/O buffers, the shift register including a plurality of flip flops configurable to multiply the rate of data being transmitted through an I/O buffer and to divide the rate of data being received through an I/O buffer, and the shift register being further configurable to provide a flip flop for use with the flip flop of an I/O buffer in a double data rate (DDR) mode of operation of the programmable I/O cell, wherein the provided shift register flip flop is clocked on one edge of a clock signal and the I/O buffer flip-flop is clocked on the opposite edge of the clock signal.

2. The programmable input/output (I/O) cell of claim 1 wherein the programmable logic device is a field programmable gate array.

* * * * *